United States Patent
Faltermeier et al.

(10) Patent No.: US 8,513,718 B2
(45) Date of Patent: Aug. 20, 2013

(54) STRESS ENHANCED TRANSISTOR DEVICES AND METHODS OF MAKING

(75) Inventors: Johnathan E. Faltermeier, Delanson, NY (US); Judson R. Holt, Wappingers Falls, NY (US); Xuefeng Hua, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/419,164

(22) Filed: Mar. 13, 2012

(65) Prior Publication Data

US 2012/0168775 A1 Jul. 5, 2012

Related U.S. Application Data

(62) Division of application No. 12/691,170, filed on Jan. 21, 2010, now Pat. No. 8,216,893.

(60) Provisional application No. 61/147,213, filed on Jan. 26, 2009.

(51) Int. Cl.
*H01L 29/76* (2006.01)

(52) U.S. Cl.
USPC .......................... 257/288; 438/197; 438/300

(58) Field of Classification Search
CPC . H01L 29/66636; H01L 29/772; H01L 29/78; H01L 29/7848; H01L 29/7849; H01L 29/1025; H01L 29/1033
USPC ................ 438/197, 300, 142; 257/E21.429, 257/E21.43, E21.431, 288
See application file for complete search history.

(56) References Cited

U.S. PATENT DOCUMENTS

| | | | |
|---|---|---|---|
| 7,303,949 B2 | 12/2007 | Chen et al. | |
| 7,303,999 B1 | 12/2007 | Sriraman et al. | |
| 7,323,391 B2 | 1/2008 | Arghavani | |
| 7,838,372 B2 | 11/2010 | Han et al. | |
| 7,906,817 B1* | 3/2011 | Wu et al. | 257/384 |
| 8,049,262 B2 | 11/2011 | Cho | |
| 2004/0021179 A1 | 2/2004 | Lee et al. | |
| 2007/0018205 A1 | 1/2007 | Chidambarrao et al. | |
| 2007/0145487 A1* | 6/2007 | Kavalieros et al. | 257/368 |
| 2007/0200170 A1 | 8/2007 | Yamasaki et al. | |
| 2007/0267703 A1 | 11/2007 | Chong et al. | |
| 2008/0048217 A1 | 2/2008 | Kim et al. | |
| 2008/0067557 A1* | 3/2008 | Yu et al. | 257/255 |
| 2008/0128746 A1 | 6/2008 | Wang | |

(Continued)

OTHER PUBLICATIONS

U.S. Appl. No. 12/693,629; Non-Final Office Action; Date Filed: Jan. 26, 2010; Date Mailed: Jan. 26, 2011.

(Continued)

*Primary Examiner* — Khiem D Nguyen
(74) *Attorney, Agent, or Firm* — Cantor Colburn LLP; Matthew Zehrer

(57) ABSTRACT

A transistor device includes a gate conductor spaced above a semiconductor substrate by a gate dielectric, wherein the semiconductor substrate comprises a channel region underneath the gate conductor and recessed regions on opposite sides of the channel region, wherein the channel region comprises undercut areas under the gate conductor; a stressed material embedded in the undercut areas of the channel region under the gate conductor; and epitaxially grown source and drain regions disposed in the recessed regions of the semiconductor substrate laterally adjacent to the stressed material.

6 Claims, 7 Drawing Sheets

(56) References Cited

U.S. PATENT DOCUMENTS

| | | |
|---|---|---|
| 2008/0277699 A1 | 11/2008 | Chakravarthi et al. |
| 2009/0140351 A1 | 6/2009 | Lin et al. |
| 2010/0187578 A1 | 7/2010 | Faltermeier et al. |
| 2010/0237431 A1 | 9/2010 | Feudel et al. |

OTHER PUBLICATIONS

U.S. Appl. No. 12/691,170; Non-Final Office Action; Date Filed: Jan. 21, 2010; Date Mailed: Dec. 2, 2011.

U.S. Appl. No. 13/301,274; Final Office Action, Date Filed: Nov. 21, 2011; Date Mailed: Feb. 25, 2013; pp. 1-11.

* cited by examiner

STRESS ENHANCED TRANSISTOR DEVICES AND METHODS OF MAKING

CROSS-REFERENCE TO RELATED APPLICATION

This application is a divisional of U.S. patent application Ser. No. 12/691,170, filed Jan. 21, 2010, now U.S. Pat. No. 8,216,893, which claims priority to non-provisional application 61/147,213, filed Jan. 26, 2009, of the disclosures of which is incorporated by reference herein in their entirety.

BACKGROUND

This invention relates generally to semiconductor fabrication, and more particularly to methods of fabricating stress enhanced transistor devices.

Integrated circuits often employ active devices known as transistors such as field effect transistors (FETs). An FET includes a silicon-based substrate comprising a pair of impurity regions, i.e., source and drain junctions, spaced apart by a channel region. A gate conductor is dielectrically spaced above the channel region of the silicon-based substrate. The junctions can comprise dopants which are opposite in type to the dopants residing within the channel region interposed between the junctions. The gate conductor can comprise a doped semiconductive material such as polycrystalline silicon ("polysilicon"). The gate conductor can serve as a mask for the channel region during the implantation of dopants into the adjacent source and drain junctions. An interlevel dielectric can be disposed across the transistors of an integrated circuit to isolate the gate areas and the junctions. Ohmic contacts can be formed through the interlevel dielectric down to the gate areas and/or junctions to couple them to overlying interconnect lines.

Demands for increased performance, functionality, and manufacturing economy for integrated circuits have resulted in extreme integration density and scaling of devices to very small sizes. Transistor device scaling has restricted operating margins and has adversely affected the electrical characteristics of such devices. As such, more emphasis has been placed on achieving higher operating frequencies for transistor devices through the use of stress engineering to improve the carrier mobility of such devices rather than through the use of scaling.

Carrier mobility in the channel of a FET device can be improved by applying mechanical stresses to the channel to induce tensile and/or compressive strain in the channel. The application of such mechanical stresses to the channel can modulate device performance and thus improve the characteristics of the FET device. For example, a process-induced tensile strain in the channel of an n-type (NFET) device can create improved electron mobility, leading to higher saturation currents.

One method used to induce strain in the channel region has been to place a compressively stressed nitride film close to the active region of the FET device. Another approach taken to induce strain in the channel of a p-type (PFET) device has been to epitaxially grow silicon germanium (e-SiGe) in the source and drain regions of the silicon-based substrate. When epitaxially grown on silicon, an unrelaxed SiGe layer can have a lattice constant that conforms to that of the silicon substrate. Upon relaxation (e.g., through a high temperature process) the SiGe lattice constant approaches that of its intrinsic lattice constant, which is larger than that of silicon. Consequently, physical stress due to this mismatch in the lattice constant is applied to the silicon-based channel region.

SUMMARY

In one embodiment, a transistor device includes a gate conductor spaced above a semiconductor substrate by a gate dielectric, wherein the semiconductor substrate comprises a channel region underneath the gate conductor and recessed regions on opposite sides of the channel region, wherein the channel region comprises undercut areas under the gate conductor; a stressed material embedded in the undercut areas of the channel region under the gate conductor; and epitaxially grown source and drain regions disposed in the recessed regions of the semiconductor substrate laterally adjacent to the stressed material.

In another embodiment, a method of fabricating a transistor device comprises: providing a semiconductor topography comprising a gate conductor spaced above a semiconductor substrate by a gate dielectric; reactive ion etching select regions of the semiconductor substrate on opposite sides of the gate conductor to form recessed regions in the substrate spaced apart by a channel region having undercut areas that extend under the gate conductor; forming a stressed material embedded in the undercut areas of the channel region under the gate conductor; and epitaxially growing source and drain regions in the recessed regions of the semiconductor substrate laterally adjacent to the stressed material.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Stress enhanced FET devices can be fabricated by etching undercut areas in a channel region of a semiconductor substrate under an overlying gate conductor, forming a stressed material embedded in those undercut areas, and epitaxially growing source and drain regions in recessed regions of the substrate adjacent to the channel region. The channel of the resulting transistor is advantageously strained by both the lattice mismatch of the epitaxially grown source and drain regions and the embedded stressed material that is strategically placed as close as possible to the channel (even partially underneath the channel) to maximize the strain. Straining the channel in this manner increases the carrier mobility in the channel and thus improves the operating characteristics of the transistor.

Figure 1:
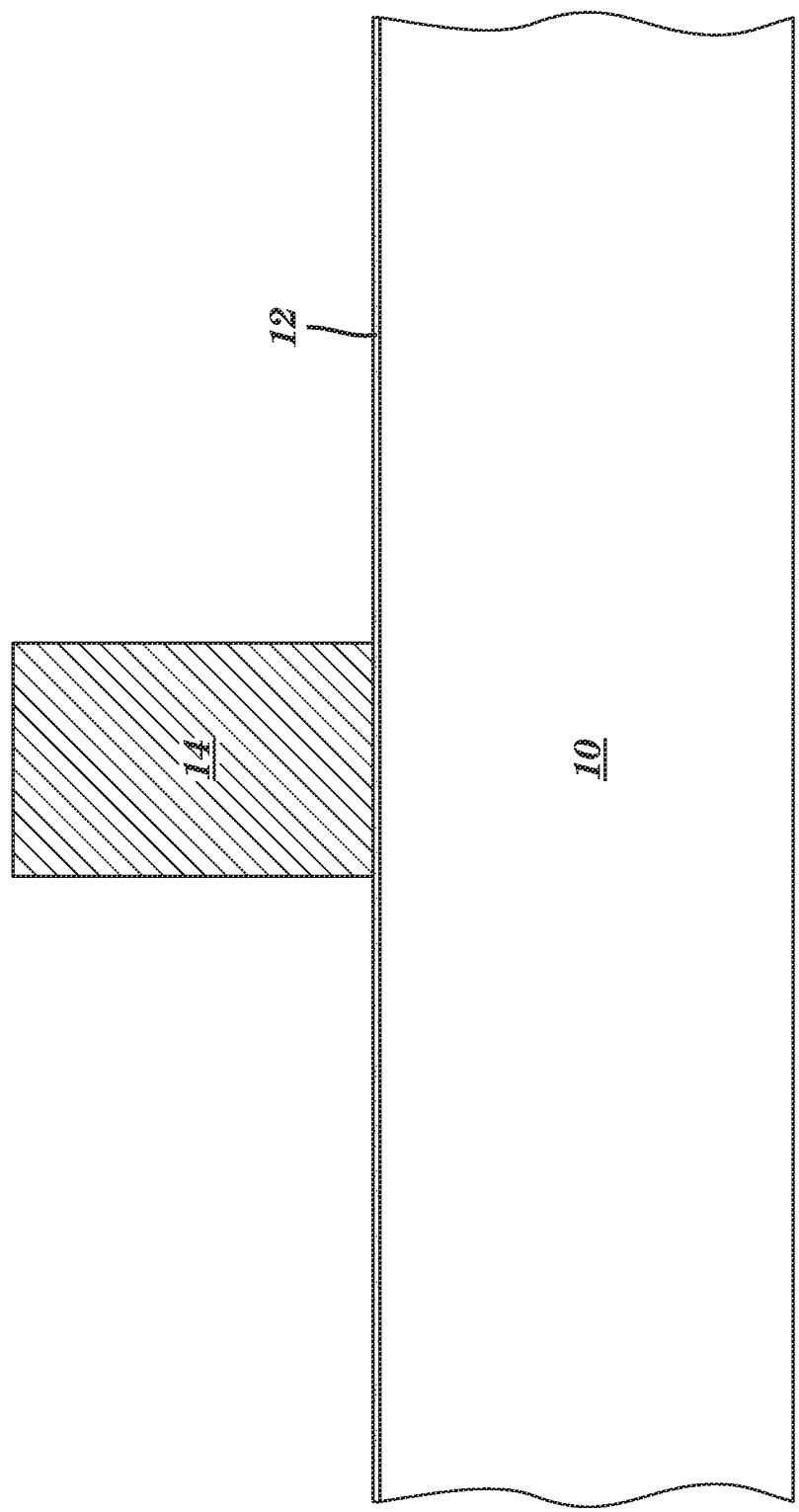
FIGS. 1-7 illustrate one example of a method for fabricating a stress enhanced transistor device comprising a stressed material embedded in undercut areas of a channel region and epitaxially grown source and drain regions disposed on opposite sides of the channel region.

Turning now to the drawings in greater detail, it will be seen that FIGS. 1-7 illustrate an exemplary embodiment of a method for fabricating stress enhanced FET devices. As shown in FIG. 1, a bulk semiconductor substrate 10 comprising single crystalline silicon that has been slightly doped with n-type or p-type dopants is first obtained to form the FET device. Alternatively, a semiconductor layer 10 can be formed upon an insulation layer (not shown) to create a silicon-on-insulator (SOI) FET device. Shallow trench isolation structures (not shown) can be formed in the semiconductor substrate 10 on opposite sides of the ensuing FET device to isolate it from other active areas in the substrate 10. A gate dielectric 12 comprising e.g., thermally grown silicon dioxide ($SiO_2$) or hafnium-based oxide (such as $HfO_3$) deposited by chemical vapor deposition (CVD), can be formed across the semiconductor substrate 10. Subsequently, a gate conductive layer comprising, e.g., polycrystalline silicon ("polysilicon"), can be deposited across the gate dielectric 12 and then patterned to define a gate conductor 14 using lithography and an anisotropic etch technique such as reactive ion etching (RIE). As shown, the etch can be terminated before the gate dielectric 12 is removed from opposite sides of the gate conductor 14, or alternatively the gate dielectric 12 can be patterned along with the gate conductor 14.

Figure 2:
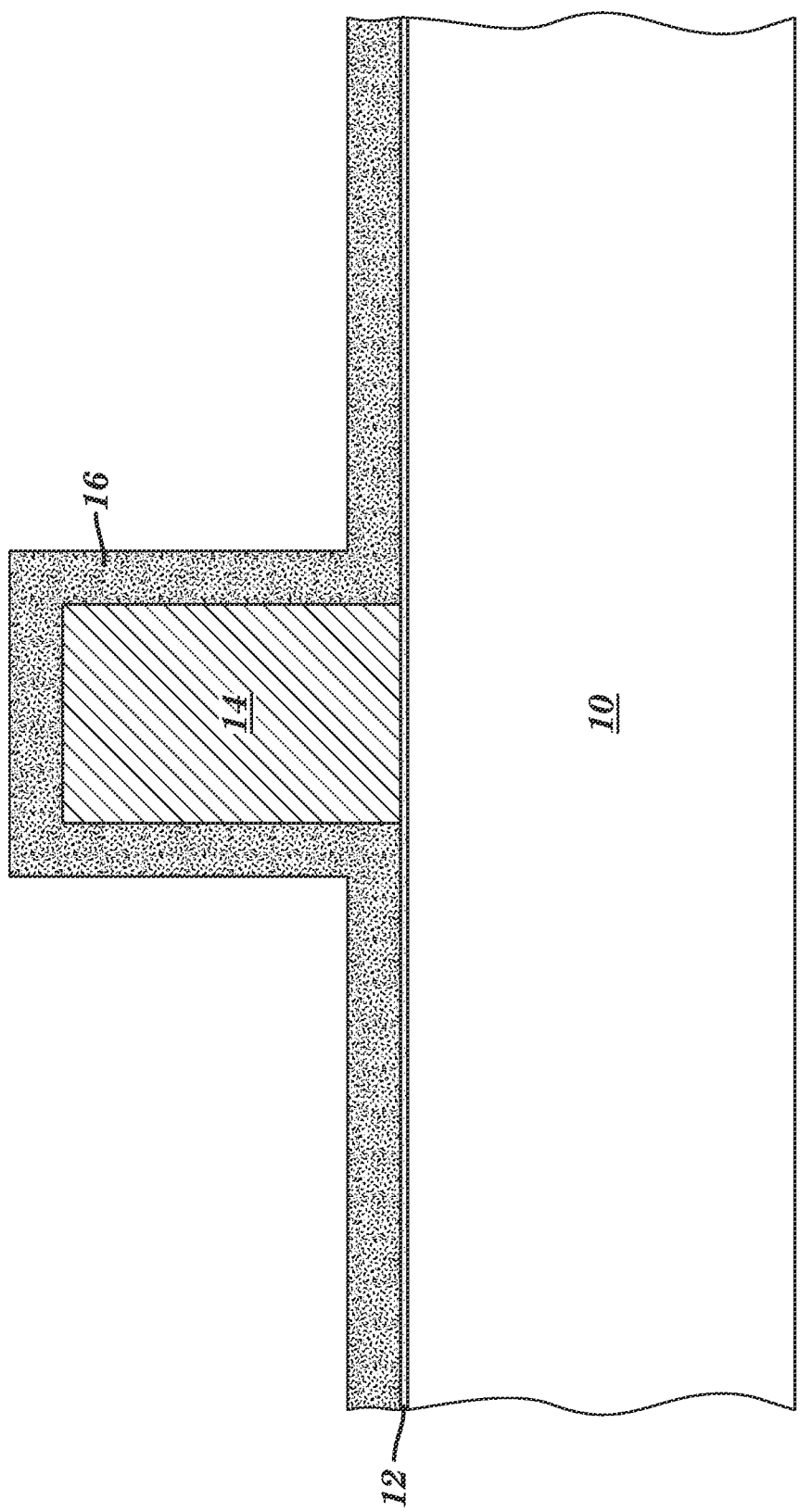
Figure 3:
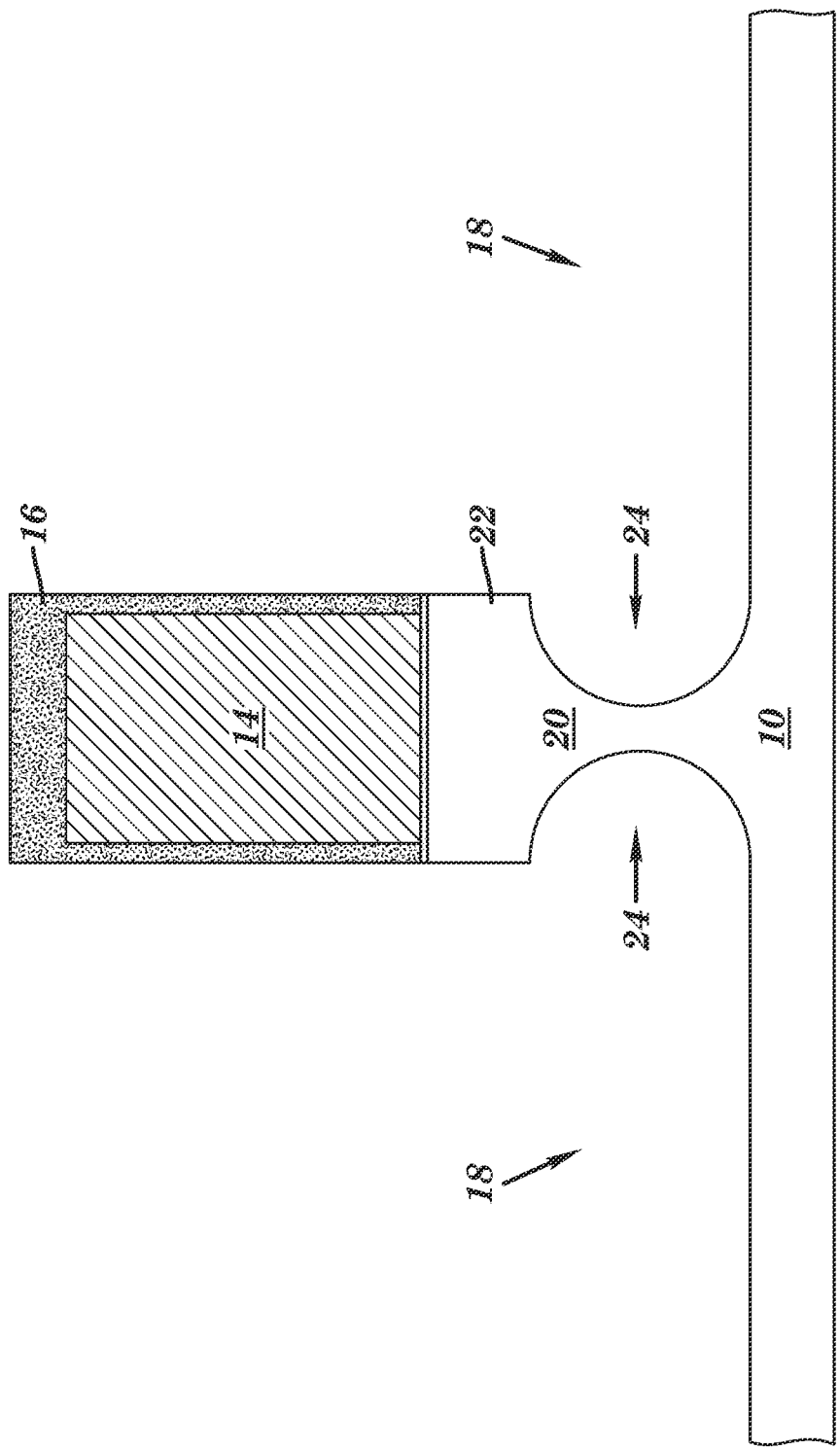

Next, as depicted in FIG. 2, a dielectric layer 16, e.g., silicon nitride ($Si_3N_4$) or silicon dioxide, can be deposited by CVD across exposed surfaces of the gate conductor 14 and the gate dielectric 12/substrate 10. As shown in FIG. 3, select regions of the dielectric layer 16 and the semiconductor substrate 10 can then be removed using lithography and an RIE process controlled to form recessed regions 18 in the substrate 10 spaced apart by a channel region 20 having undercut areas 24 with respect to the gate conductor 14. The dielectric layer 16 is left remaining laterally adjacent to sidewalls of the gate conductor 14 and upon an upper surface of the gate conductor 16.

In an embodiment, the RIE process shown in FIG. 3 can be controlled to initially perform an anisotropic etch to define an upper pillar 22 in the channel region 20 having substantially linear sidewall surfaces. The dimensions of the pillar 22 and the undercut areas 24 can be independently controlled as described below. By way of example, if the substrate 10 comprises silicon, the anisotropic etch used to form pillar 22 can be performed using mixtures of HBr, He, and $O_2$ gases, but other gases such as $Cl_2$, $BCl_3$, Ar, and various fluorocarbon species could also be used. Next, the interior surfaces of the resulting trench can be exposed to an oxygen-bearing plasma to convert those surfaces, particularly the vertical sidewalls, to a silicon oxide. Thereafter, the oxidized silicon can be removed from the bottom of the trench via another plasma process in which the etch chemistry and conditions are chosen according to the thickness and characteristics of the oxidized layer.

Subsequently, an isotropic etch can be performed to create the undercut areas 24 in the channel region 20 below the pillar 22. The conditions of this process can be chosen to etch pure silicon without etching the oxidized silicon. In one example, a mixture of $Cl_2$, $SF_6$, and $N_2$ gases can be used to generate the undercut areas 24. It is understood that other gases could also be used. In this step, etching proceeds downward at the trench bottom and laterally under the gate from the bottom corner of the oxidized and protected sidewall. If the process were completely isotropic, etching would also proceed upward through the unoxidized silicon behind the protected sidewall, approaching the underside of the gate dielectric; however, the approach described herein instead allows the lateral etching to proceed farther before the upper edge of the recess approaches the gate dielectric. As a result of this step, the sidewalls of the undercut areas 24 become substantially semicircular in shape.

Figure 4:
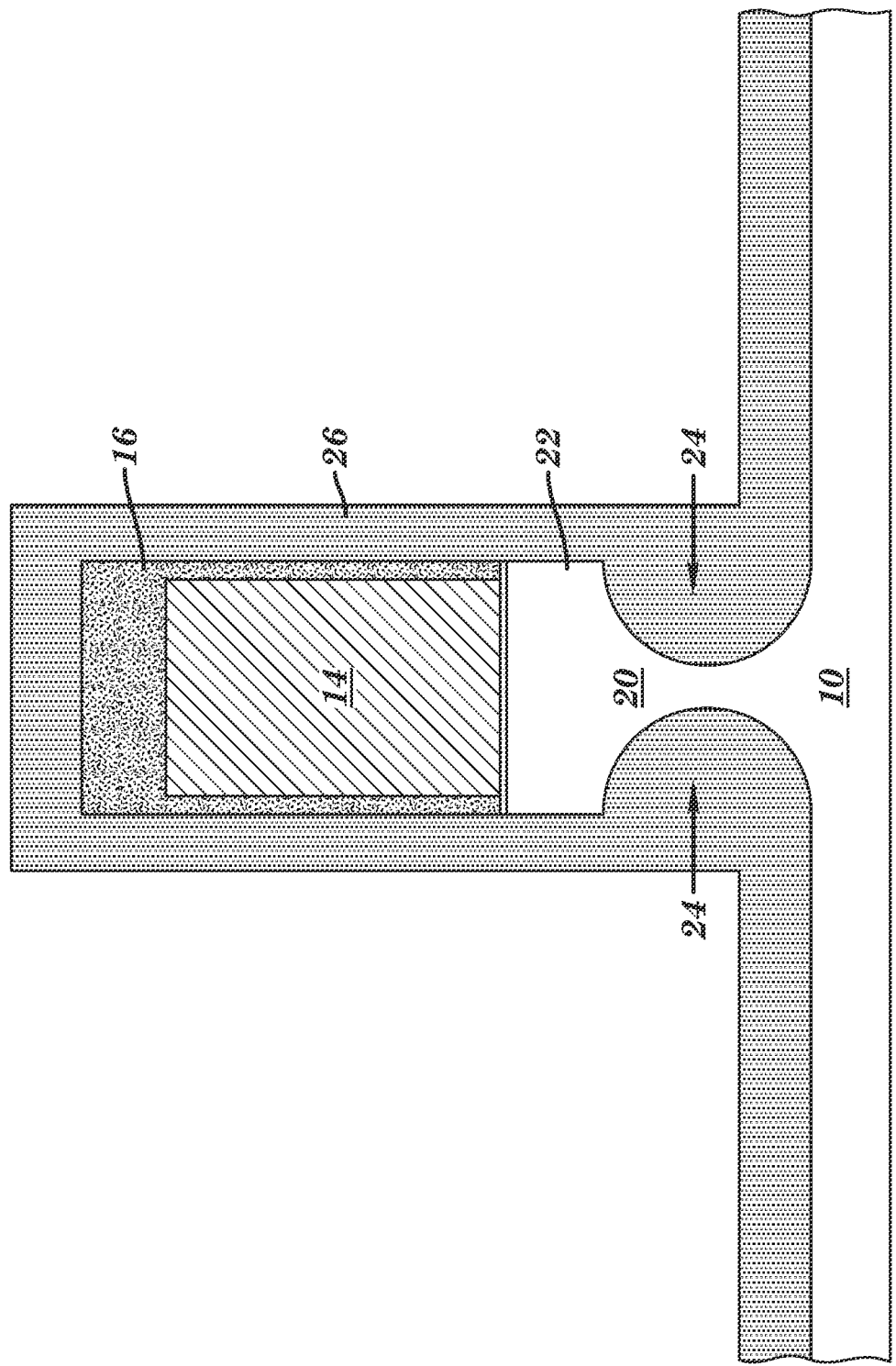

Turning to FIG. 4, a stressed material 26 can be formed as a layer across the substrate 10 and the dielectric layer 16. Examples of suitable stressed materials include but are not limited to stressed amorphous silicon nitride ("nitride"), amorphous silicon dioxide ("oxide"), amorphous carbon, amorphous boron, and combinations comprising at least one of the foregoing. In the case where the stressed material 26 is stressed nitride, it can be formed to have either compressive or tensile stress using CVD. The type of stress, namely tensile or compressive, and the stress level of the deposited nitride can be established by controlling a number of different processing parameters, such as the temperature, gas energizer power level, and gas flows and flow ratios and pressure, and/or by treating the deposited nitride. The stressed nitride can be treated after deposition to modify its stress. For example, the amount of hydrogen in the stressed nitride can be altered through ultra-violet or electron beam exposure. In one example, the stressed nitride has an absolute value of a compressive stress of at least about 2.5 GigaPascals (GPa), specifically about 2.5 GPa to about 3.5 GPa. In another example, the stressed nitride has a tensile stress of at least about 1.5 GPa, specifically about 1.5 GPa to about 2 GPa.

Figure 5:
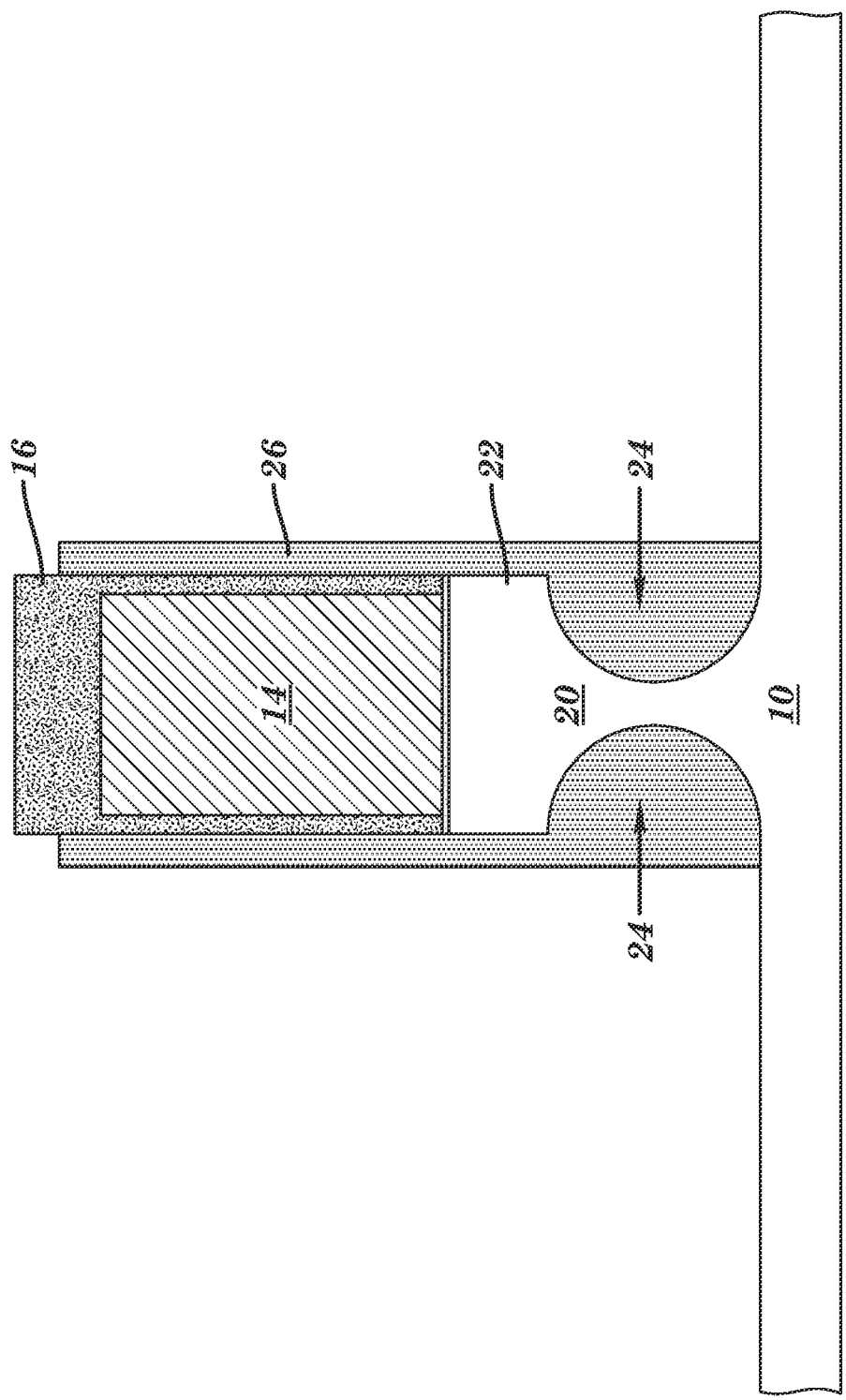
Figure 6:
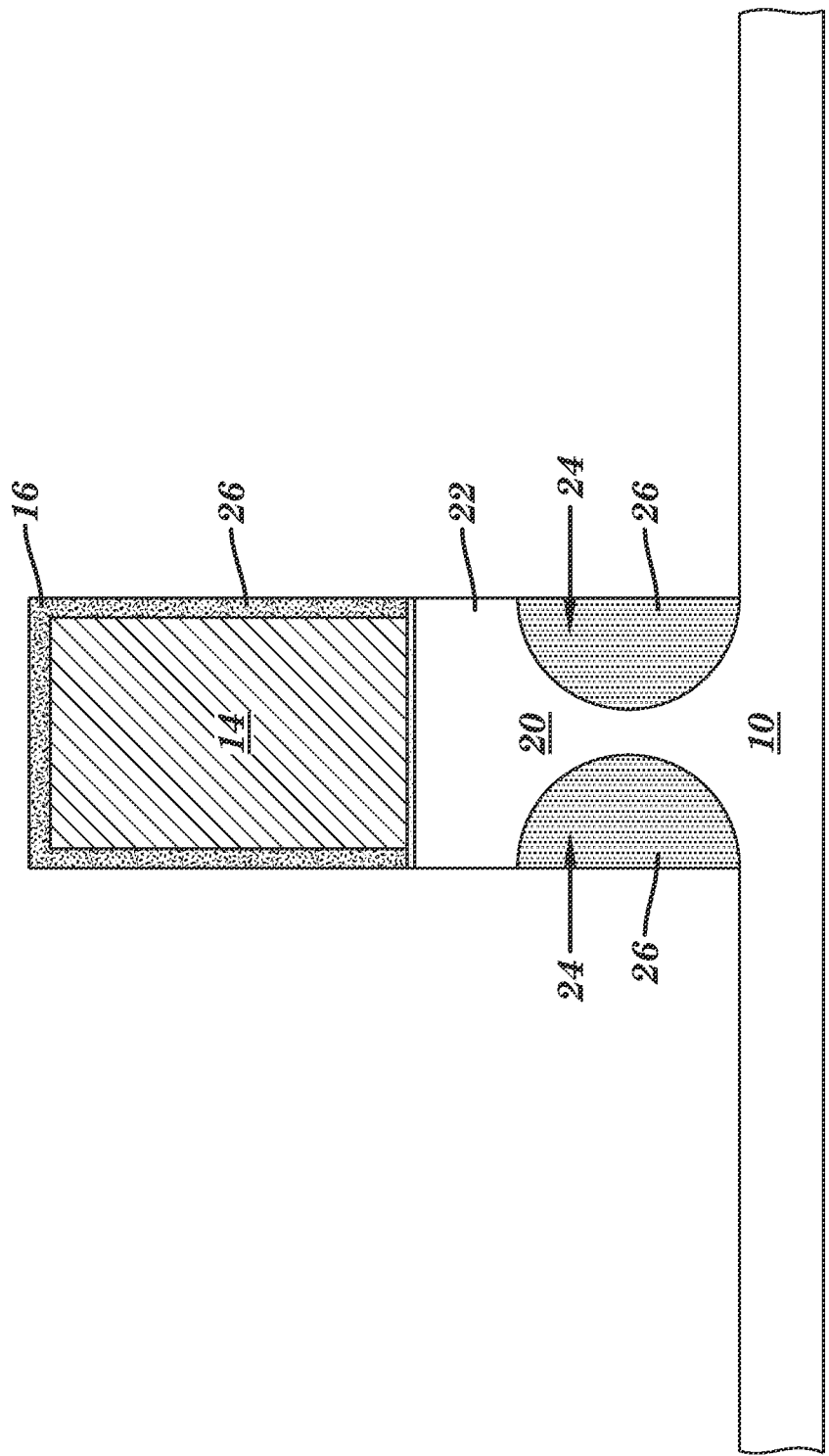

As illustrated in FIG. 5, the stressed material 26 can subsequently be anisotropically etched using an RIE process selective to the stressed material 26 to remove a portion of the stressed material 26 from above the substrate 10. In an embodiment in which the stressed material 26 is nitride and the dielectric layer 16 is oxide, the dielectric layer 16 would not be removed by this anisotropic etch. Next, as shown in FIG. 6, the remaining portion of the stressed material 26 can be subjected to a selective isotropic etch that is terminated after the stressed material 26 has been removed from all areas except from within the undercut areas 24 of the channel region 20. In one example, this isotropic etch can be performed using an isotropic RIE process. In another example, this isotropic etch can be performed by contacting the stressed material 26 with a wet etchant such as a mixture of hydrofluoric acid and ethylene glycol, which would etch oxide (e.g., the dielectric layer 16) at the same rate as nitride. In this manner, the stressed material 26 becomes embedded in the undercut areas 24 of the channel region 20 under the gate conductor 14 where it can cause strain within the channel region 20. As shown, the final form of the stressed material 26 can be substantially semicircular in shape to correspond to the shape of the sidewalls of the undercut areas 24.

Figure 7:
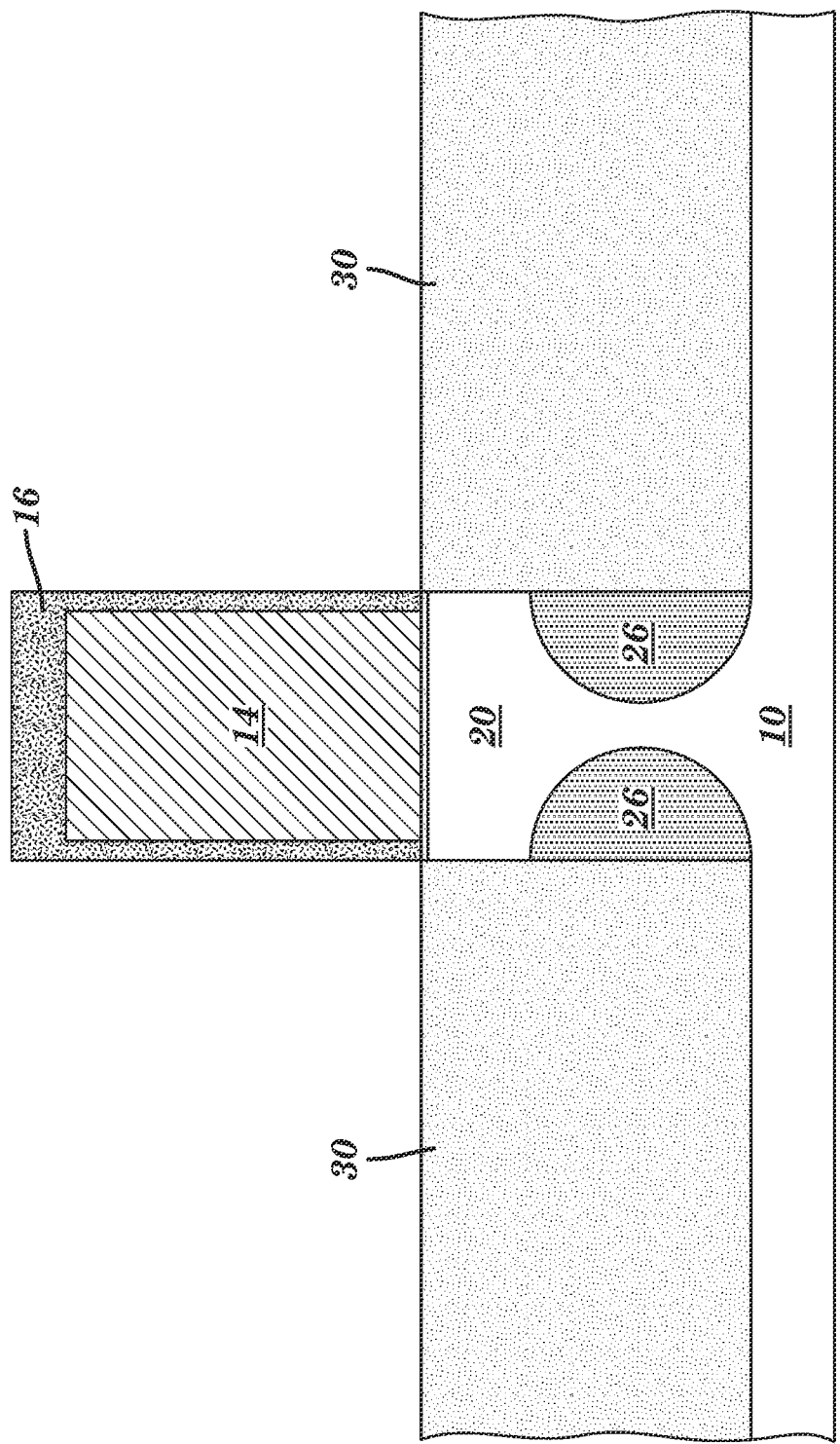

As shown in FIG. 7, epitaxially grown source and drain regions 30 can subsequently be formed in the recessed regions of semiconductor substrate 10 laterally adjacent to the channel region 20 and the embedded stressed material 26. The epitaxial growth can be performed at a temperature of about 500° C. to about 900° C. and a pressure of about 1 Torr to about 100 Torr using precursors such as $SiH_4$, $SiH_2Cl_2$, $GeH_4$, HCl, $B_2H_6$, $SiH_3CH_3$, etc. When forming a PFET device, the epitaxial source and drain regions 30 can comprise, e.g., silicon germanium (SiGe), and when forming an NFET device, the epitaxial source and drain regions 30 can comprise, e.g., silicon carbide (SiC). The dielectric layer 16 can then be removed using, e.g., an isotropic etch, to allow metal silicide contact areas and then metal contacts to be formed on the gate conductor 14 and the epitaxial source and drain regions 30. The mismatch of the crystal lattice between the epitaxial source and drain regions 30 and the channel region 20 can induce additional strain in the channel region 20.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A transistor device comprising:
    a gate conductor spaced above a semiconductor substrate by a gate dielectric, wherein the semiconductor substrate comprises a channel region underneath the gate conductor, the channel region having an upper pillar with substantially vertical sidewalls directly beneath the gate dielectric, and recessed regions of the semiconductor substrate defined below the upper pillar, the recessed regions having a semicircular profile defined entirely between the substantially vertical sidewalls of the upper pillar;
    a stressed material embedded in the recessed regions such that a first surface of the stressed material is substantially vertical and in alignment with the substantially vertical sidewalls of the upper pillar, and a second surface of the stressed material conforms to the semicircular profile of the recessed regions; and
    epitaxially grown source and drain regions disposed in the recessed regions of the semiconductor substrate laterally adjacent to the stressed material, the source and drain regions having substantially vertical sidewalls that abut the substantially vertical sidewalls of the upper pillar and the substantially vertical first surface of the stressed material.

2. The transistor device of claim 1, further comprising a dielectric layer disposed adjacent to sidewall surfaces of the gate conductor, wherein the sidewalls of the upper pillar of the channel region are aligned to exterior sidewalls of the dielectric layer.

3. The transistor device of claim 2, wherein the dielectric layer comprises one or more of: silicon nitride and silicon dioxide.

4. The transistor device of claim 1, wherein the transistor device is a PFET device and the epitaxially grown source and drain regions comprise silicon germanium.

5. The transistor device of claim 1, wherein the transistor device is an NFET device and the epitaxially grown source and drain regions comprise silicon carbide.

6. The transistor device of claim 1, wherein the stressed material comprises one or more of: stressed amorphous silicon nitride, stressed amorphous silicon oxide, stressed amorphous carbon, and stressed amorphous boron.

* * * * *